United States Patent [19]

Stevens

[11] Patent Number: 4,974,043
[45] Date of Patent: Nov. 27, 1990

[54] SOLID-STATE IMAGE SENSOR

[75] Inventor: Eric G. Stevens, Rochester, N.Y.

[73] Assignee: Eastman Kodak Company, Rochester, N.Y.

[21] Appl. No.: 420,869

[22] Filed: Oct. 12, 1989

[51] Int. Cl.$^5$ .......................................... H01L 29/78
[52] U.S. Cl. ....................................... 357/24; 357/30
[58] Field of Search ................ 357/24 LR, 24, 30 H; 358/213.13, 213.19, 213.24

[56] References Cited

U.S. PATENT DOCUMENTS

| | | | |
|---|---|---|---|
| 4,460,912 | 7/1984 | Takeshita et al. | 357/24 |
| 4,471,228 | 9/1984 | Nishizawa et al. | 250/578 |
| 4,613,402 | 9/1986 | Losee et al. | 156/643 |
| 4,679,212 | 7/1987 | Hynecek | 377/58 |
| 4,696,021 | 9/1987 | Kawahara et al. | 377/58 |
| 4,716,466 | 12/1987 | Miida et al. | 358/213.26 |
| 4,760,435 | 7/1988 | Burt | 357/24 |
| 4,851,915 | 7/1989 | Yang et al. | 357/24 LR |
| 4,881,249 | 11/1989 | Chautemps et al. | 357/24 LR |

*Primary Examiner*—Andrew J. James
*Assistant Examiner*—Courtney A. Bowers

[57] ABSTRACT

A solid-state image sensor comprises a plurality of photodetectors in a substrate of a semiconductor material at a major surface of the substrate and arranged in an array of rows and columns. A separate shift register, such as a CCD shift register, is in the substrate and extends along each column of the photodetectors. Transfer gates are provided to selectively transfer charge carriers from the photodetectors to their adjacent shift register. A separate drain region is provided in the substrate at the major surface adjacent each photodetector and between adjacent photodetectors in each column. A virtual barrier region is provided across an edge of each photodetector between the photodetector and its adjacent drain region. A gate is provided across the space between adjacent photodetectors in each column for selectively allowing charge carriers in each photodetector to be transferred to the drain of the adjacent photodetector to allow the photodetector to be reset and thereby control the exposure time of the photodetectors. The drain region serves as an anti-blooming drain for its adjacent photodetector as well as a drain for resetting the photodetectors.

19 Claims, 3 Drawing Sheets

SOLID-STATE IMAGE SENSOR

FIELD OF THE INVENTION

The present invention relates to a solid-state image sensor, and, more particularly, to a solid-state image sensor which comprises a plurality of photodiodes and charge coupled device (CCD) transfer registers to carry the charge from the photodetectors and which includes electronic shutter and anti-blooming structure.

BACKGROUND OF THE INVENTION

Solid-state image sensors, in general, comprise a plurality of photodetectors arranged in rows and columns, and shift registers, such as CCD shift registers, between the columns of the photodetectors. The photodetectors in each column are coupled, such as by a transfer gate, to their adjacent shift register so that the charge carriers generated and accumulated in the photodetectors can be selectively transferred to the shift register. The shift registers transfer the charge carriers to the read-out of the image sensor.

One problem which has arisen in this type of solid-state image sensor is referred to as "blooming". If, during the accumulation period of the image sensor, the period when the photodetectors are receiving photons from the image and converting the photons to charge carriers, a photodetector accumulates an excess amount of the charge carriers, some of the charge carriers will overflow from the photodetector into the adjacent shift register and/or photodetector. This adversely affects the charge carriers in the shift register being transferred to the read-out causing "blooming". A conventional technique used for preventing blooming, i.e. an anti-blooming technique, uses an overflow drain adjacent the photodetector with the drain being isolated from the photodetector by a potential barrier. The potential barrier between the photodetector and the anti-blooming drain is lower than the barrier provided by the transfer gate between the photodetector and the CCD shift register during the accumulation period. Thus, if the charge level in the photodetector reaches a sufficient amount to raise the photodetector potential to a level above that of the barrier between the photodetector and the anti-blooming drain, additional signal carriers will be swept over into the anti-blooming drain where they are removed by the drain supply. This prevent excess charge from flowing into the shift register during the integration period and thereby prevents blooming.

Another problem which has arisen in certain types of solid-state image sensors relates to controlling the exposure time of the photodetectors. For certain applications, such as still photography, it is desirable to be able to control the time that the photodetectors generate charge carriers as a result of being exposed to the image being taken. Various shuttering techniques have been developed for this purpose. However, the structure which has been required to achieve the shuttering for exposure control as well as the gating and drain required for anti-blooming control has taken up space on the image sensor and therefore has reduced the fill factor of the image sensor. Therefore, it would be desirable to have a solid-state image sensor which includes both a shutter for exposure control and anti-blooming features in which the number of elements required for these features is minimized to improve the fill factor of the image sensor and reduce the number of electrodes required to provide these features thereby reducing system complexity.

SUMMARY OF THE INVENTION

The present invention relates to a solid-state image sensor which includes a plurality of spaced photodetectors arranged in a line and a shift register, such as a CCD shift register, extending along the line of photodetectors. Each photodetector has adjacent thereto and between adjacent photodetectors a drain with a potential barrier being between the photodetector and the drain. Between each pair of adjacent photodetectors is a shuttering means, such as an extension of a gate of the CCD shift register, for controlling the potential barrier between the photodetector and the drain of the adjacent photodetector. During the operation of the imager, the drain serves as an anti-blooming drain for its respective photodetector. In addition, the shuttering means can be operated to lower the potential barrier between each photodetector and the drain of the adjacent photodetector so as to allow any charge carriers in the photodetector to flow into the drain and thereby reset the photodetector. Thus, the drain serves as an anti-blooming drain as well as part of the shutter to control exposure time.

More particularly, the present invention relates to a solid-state image sensor comprising a substrate of a semiconductor material of one conductivity type having a major surface. A plurality of spaced photodetectors are in the substrate at the major surface and are arranged in a line. A shift register extends along the line of photodetectors. A drain is in the substrate at the major surface adjacent each photodetector and between adjacent photodetectors. Means is provided to form a potential barrier between each photodetector and its drain, and means is provided between each photodetector and the drain of the adjacent photodetector for selectively transferring charge carriers from each photodetector to the drain of the adjacent photodetector.

The invention will be better understood from the following more detailed description taken with the accompanying drawings and claims.

It should be understood that the FIGS. of the drawings are not necessarily drawn to scale.

DETAILED DESCRIPTION

Figure 1:
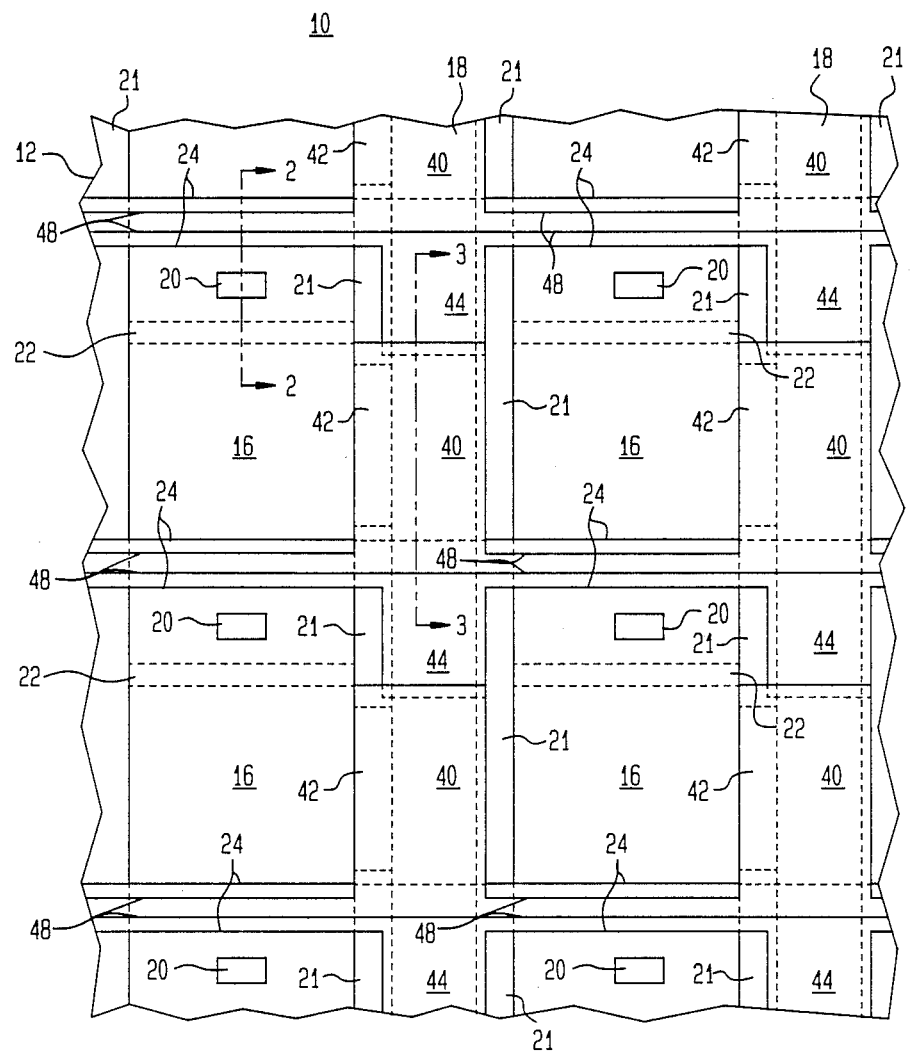
FIG. 1 is a top plan view of a portion of a solid-state image sensor in accordance with the present invention.
Figure 2:
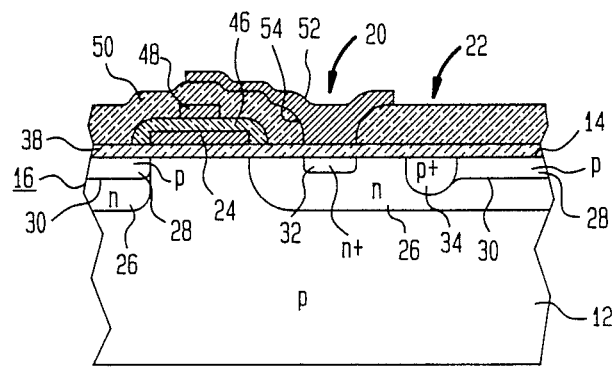
FIG. 2 is a sectional view of a portion of the solid-state image sensor taken along line 2—2 of FIG. 1.
Figure 3:
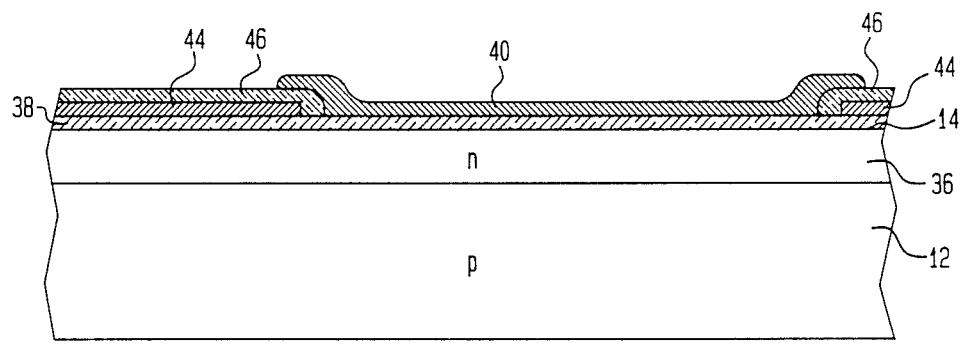
FIG. 3 is a sectional view of a portion of the solid-state image sensor taken along line 3—3 of FIG. 1.

Referring to FIGS. 1, 2 and 3, there is shown a solid-state image sensor 10 in accordance with the present invention. FIG. 1 is a top view. To simplify FIG. 1, metal contacts are not shown and it assumed that dielectric layers thereof are transparent. FIG. 2 is a sectional view taken along line 2—2 of FIG. 1. FIG. 3 is a sectional view taken along line 3—3 of FIG. 1. Image sensor 10 comprises a substrate 12 of a semiconductor material, such as single crystalline silicon, of one conductivity type, such as p-type, having a major surface 14. In the substrate 12 and along the major surface 14 are a plurality of spaced photodetectors 16. The photodetectors 16 are arranged in lines, such as rows and columns, to form an area array. Along each column of the photodetectors 16 is a shift register 18, shown as a CCD shift register, which extends along a line of the photodetectors 16. Adjacent each photodetector 16 and between adjacent photodetectors 16 is a drain 20 with an anti-blooming barrier 22 being between each drain 20 and its adjacent photodetector 16. Between each photodetector 16 and the drain 20 of the adjacent photodetector 16 is a shutter gate 24 for controlling the potential barrier between the photodetector 16 and the drain 20 of the adjacent photodetector 16. Although not shown, there is a separate drain 20 adjacent and separated from the photodetector 16 at the bottom of each column and a shutter gate 24 between the drain 20 and the bottom most photodiode 16. A separate transfer gate 42 is shown between each of the photodiodes 16 and shift registers 18.

As shown in FIG. 2, each photodetector 16 is a photodiode formed in a portion of substrate 12 and comprises a first region 26 of a conductivity type opposite that of the substrate 12, shown as n-type, and a second region 28 which is within a portion of region 26 and is of the same conductivity type as the substrate 12, shown as p/type, and which extends to the major surface 14. Typically, the conductivity of the first region 26 is about $10^{17}$ impurities/cm$^3$. Typically, the conductivity of the second region 28 is about $10^{17}$ impurities/cm$^3$. The second region 28 forms a pn junction 30 with the first region 26. The first region 26 extends under the drain 20 and the anti-blooming barrier 22, and the second region 28 extends under the anti-blooming barrier 34. The second region 28 is connected to ground through channel stop regions 21 (shown only in FIG. 1) which extend along the photodiodes 16. The substrate 12, first region 26 and second region 28 form a "pinned" diode. Although other types of photodiodes can be used, a "pinned" diode is preferable since it eliminates differences in reset levels resulting from the separate gates 24 and 42.

The drain 20 comprises a region 32 of the same conductivity type as the first region 26 but of higher conductivity, shown as n+ type, in the substrate 12 and extending to the major surface 14 and within a portion of the first region 26. Typically, the conductivity of the drain region 32 is about $10^{19}$ impurities/cm$^3$. The anti-blooming barrier 22 is a virtual gate and comprises a region 34 of the same conductivity type as the second region 28 but of higher conductivity, shown as p+ type, in the substrate 12 and extending to the major surface 14 and within a portion of the first region 26. Typically, the anti-blooming barrier region 34 is of a conductivity of about $10^{18}$ impurities/cm$^3$. The anti-blooming barrier region 34 extends along an edge of the second region 28 between the second region 28 and the drain region 32.

As shown in FIG. 3, each of the CCD shift registers 18 comprises a buried channel 36 comprising a region of a conductivity type opposite that of the substrate 12, shown as n-type, in the substrate 12 and extending to the major surface 14. The channel region 36 is typically of a conductivity of about $10^{17}$ impurities/cm$^3$. The channel region 36 extends between two columns of the photodetectors 16 for the full length of the columns with the channel region 36 being spaced from the photodetectors 16 in both of the adjacent columns. A thin layer 38 of an insulating material, typically silicon dioxide, is on the major surface 14 over the channel region 36 and the areas of the major surface 14 between adjacent photodetectors 16 in each column. A first set of CCD gates 40 are on the silicon dioxide layer 38 and are spaced along the channel region 36. Each of the first gates 40 contacts one of the transfer gates 42 which extends across the space between the channel region 36 and the first region 26 of the photodetector 16 and serves as a transfer gate. A second set of CCD gates 44 are on the silicon dioxide layer 38 with each second gate 44 being between a pair of the first gates 40. Each of the first gates 40 overlaps a portion of each of its adjacent second gates 44 and is insulated therefrom by a layer of an insulating material 46, typically silicon dioxide. As described in U.S. Pat. No. 4,613,402 to David L. Losee et al, issued Sept. 23, 1986, entitled "Method of Making Edge-Aligned Implants and Electrodes Therefor", a transfer region, not shown, of a conductivity type opposite that of the channel region 36 may be provided in the channel region under an edge of each gate 40 and 44. The gates 24, 40, 42, 44 and 48 are of a conductive material, typically doped polycrystalline silicon.

As shown in FIG. 2, the shutter gate 24 is an extension of one of the second gates 44 which is on the silicon dioxide layer 38 and extends across the space between the first regions 26 of adjacent photodetectors 16 in each column. Each of the first gates 42 has an extension 48 which extends over a shutter gate 24 and is insulated therefrom by a portion of the silicon dioxide layer 46. A thick layer 50 of an insulating material, typically silicon dioxide, extends over the photodetectors 16 and the CCD shift registers 18 to protect them. A conductive contact 52, which may be a film of a metal, extends through an opening 54 in the insulating layer 50 to make contact with each drain region 32 so as to allow each drain 20 to be connected to a voltage source. The contact layer 52 also extends over the adjacent shutter gate 24 and CCD shift registers 18 of FIG. 1 to shield these regions from the impinging light.

Figure 4:
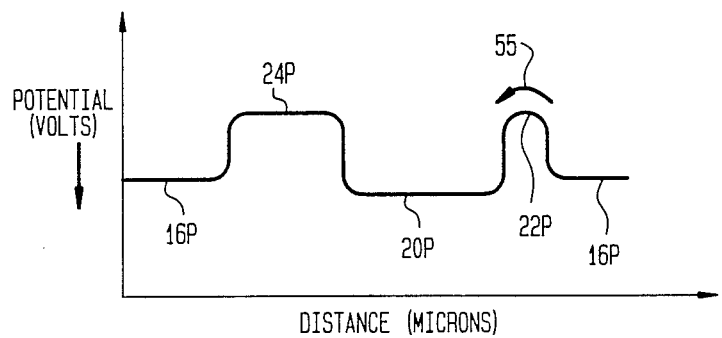
FIG. 4 is a potential diagram of the solid-state image sensor shown in FIG. 1 during integration period.

As shown in FIG. 4, during the integration period of the image sensor 10, the potential 22P in the anti-blooming barrier region 34 is lower than the potentials 16P and 20P in the photodetector 16 and drain 20 respectively because of the higher doping level in the barrier region 34. Although not shown, the potential 22P is higher than the potential under the CCD transfer gate 42. Thus, if the amount of the charge carriers collected in the photodetector 16 reduces the photodetector potential to a level below the barrier potential 22P, additional carriers will be swept over into the drain 20 as indicated by the arrow 54. This provides for anti-blooming in the image sensor 10.

Figure 5:
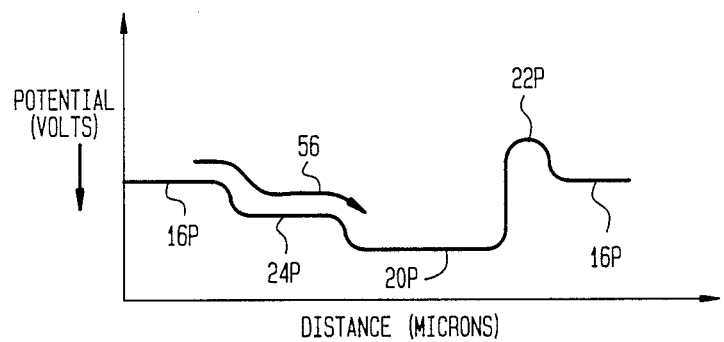
FIG. 5 is a potential diagram of the solid-state image sensor during photodetector reset.

To control the exposure time of the image sensor 10, at a time t during the integration period prior to the transfer period equal to the desired exposure time, the photodetectors 16 are reset. As shown in FIG. 5, the photodetectors 16 are reset by applying a voltage to the shutter gates 24 through the second gates 44 of the CCD shift register so as to raise the potential 24P under the shutter gates 24 to a level above the potential 16P in the photodetectors 16. This allows the charge carriers in the photodetectors 16 to flow across the area under the shutter gates 24 into the drain 20 as indicated by the arrow 56. Once the photodetectors 16 have been dumped of the charge carriers, the voltage on the shutter gate 24 is lowered to provide the potential barrier 24P shown in FIG. 4.

After the desired exposure time t, the charge carriers collected in the photodetectors 16 during the exposure time are transferred to the CCD shift register 18. This is achieved by applying a potential to each of the first gates 40 so that the potential under each transfer gate 42 is raised above that in the photodetectors 16. The charge carriers will then flow across the space under the transfer gates 42 into the shift register channel 36. Although, the first gates 42 have an extension 48 over the area between each photodetector 16 and the drain 20 of the adjacent photodetector 16, the effect of the voltage on the gate extension 48 is shielded by the shutter gate 24. Thus, the voltage on the first gates 42 do not cause the charge carriers in the photodetectors 16 to flow into the drains 20 of the adjacent photodetectors 16. The CCD shift register 18 is then operated in the normal manner to transfer the charge carriers along the shift register 18 to a read-out of the imager 10. During the operation of the shift register 18, the voltages applied to the gates 40 and 44 to move the charge carriers along the channel region 32 is less than that applied to the gates during the reset and transfer periods so as not to reduce the barriers under transfer gate 42 and exposure gate 24.

Thus, there is provided by present invention a solid-state image sensor 10 in which the drain 20 serves the dual purpose of an anti-blooming drain and a drain for resetting the photodetectors 16 to achieve a desired exposure control. Also, the exposure control shutter 24 is a part of the gates of the CCD shift registers 18 and merely extends across the necessary space between adjacent photodetectors 16 in each column. Thus, both exposure control and anti-blooming are achieved using a minimum number of elements and without taking up any substantial amount of additional space on the substrate 12 so that the fill factor of the imager is not substantially lowered. Although the solid-state image sensor 10 has been shown as having pn junction type photodiodes as the photodetectors 16, other types of photodetectors can be used. Also, although the shift registers 18 have been shown as being CCD shift registers, other types of shift register can be used which has a gate which can also be used as the shutter gate 24.

It is to be understood that the specific embodiments described herein are merely illustrative of the spirit of the invention. Various modifications consistent with the spirit of the invention are possible.

What is claimed is:

1. A solid-state image sensor comprising:
   a substrate of a semiconductor material of one conductivity type having a major surface;
   a plurality of photodetectors in said substrate at said major surface and arranged in a line;
   a shift register extending along said line of photodetectors;
   a drain adjacent a side of each photodetector between adjacent photodetectors of the line;
   means providing a potential barrier between each drain and its adjacent photodetector; and
   means for selectively transferring charge carriers from each photodetector across a space between adjacent photodetectors to the drain of the adjacent photodetector.

2. The solid-state image sensor of claim 1 in which each photodetector comprises a first region of the opposite conductivity type in the substrate at said major surface, and the drain comprises a region of the opposite conductivity type in the substrate at said major surface and within the first region adjacent an edge of the first region.

3. The solid-state image sensor of claim 2 in which the means forming a barrier between the drain and its adjacent photodetector comprises a highly conductive region of the one conductivity type in the substrate at said major surface and within and extending across the first region of the photodetector.

4. The solid-state image sensor of claim 3 in which the means for transferring charge carriers from each photodetector to the drain region of the adjacent photodetector comprises a conductive gate over and insulated from said major surface across the space between the first regions of adjacent photodetectors in the line.

5. The solid-state image sensor of claim 4 in which each photodetector further comprises a second region of the one conductivity type in the substrate at said major surface and within the first region.

6. The solid-state image sensor of claim 5 in which the barrier region is of a higher conductivity type than the second region of the photodetector and extends along one edge of the second region between the second region and the drain region.

7. The solid-state image sensor of claim 6 in which the shift register comprises a charge coupled device shift register having a channel region extending along and spaced from the line of photodetectors and a plurality of conductive gates over and insulated from the major surface and across the channel region.

8. The solid-state image sensor of claim 7 in which the shift register further comprises a first set of conductive gates spaced along the channel region and a second set of gates arranged in the spaces between the first set of gates, each of the first set of gates having a transfer portion extending across the space between a photodetector and the channel region.

9. The solid-state image sensor of claim 8 in which each of the gates extending between adjacent photodetectors is an extension of one of the second set of gates of the shift register.

10. A solid-state image sensor comprising:
    a substrate of a semiconductor material of one conductivity type having a major surface;
    a plurality of photodetectors in said substrate at said major surface, said photodetectors being arranged in an array of rows and columns;
    a separate shift register extending along each column of the photodetectors;
    means for selectively transferring charge carriers from each photodetector to its adjacent shift register;
    a drain adjacent each of said photodetectors and between adjacent photodetectors of each column;
    means providing a potential barrier between each drain and its adjacent photodetector; and
    means for selectively transferring charge carriers from each photodetector across a space between adjacent photodetectors in the column to the drain of the adjacent photodetector in the column.

11. The solid-state image sensor of claim 10 in which each photodetector comprises a first region of the opposite conductivity type in the substrate at the major surface and the drain comprises a region of the opposite conductivity type in the substrate at said major surface within the first region of its adjacent photodetector and adjacent an edge of the first region.

12. The solid-state image sensor of claim 11 in which the means providing a barrier between the drain and the adjacent photodetector comprises a highly conductive region of the one conductivity type in the substrate at the major surface and within and extending across the first region.

13. The solid-state image sensor of claim 12 in which the means for transferring charge carriers from each photodetector to the drain region of the adjacent photodetector comprises a conductive gate over and insulated from the major surface across the space between adjacent first regions of adjacent photodetectors in each column.

14. The solid-state image sensor of claim 13 in which each photodetector further comprises a second region of the one conductivity type in the substrate at the major surface and within the first region.

15. The solid-state image sensor of claim 14 in which the barrier region is of a higher conductivity than the second region of the photodetector and extends along an edge of the second region between the second region and the adjacent drain region.

16. The solid-state image sensor of claim 15 in which each shift register is a charge coupled device shift register comprising a channel region extending along and spaced from the photodetectors in the adjacent columns, and a plurality of conductive gate over and insulated from the major surface and across the channel region.

17. The solid-state image sensor of claim 16 in which the shift register further comprises a first set of conductive gates spaced along the channel region and a second set of conductive gate arranged in the spaces between the gates of the first set.

18. The solid-state image sensor of claim 17 in which the means for selectively transferring charge carriers from the photodetectors to the shift register comprises an extension of each of the gates of the first set extending across the space between a photodetector and the channel region.

19. The solid-state image sensor of claim 18 in which each of the gates extending between adjacent photodetectors in each column of photodetectors is an extension of one of the gates of the second set of gates of the adjacent shift register.

* * * * *